United States Patent
Podeyn et al.

(10) Patent No.: US 6,573,618 B2
(45) Date of Patent: Jun. 3, 2003

(54) COMPACT PULSE-CURRENT SUPPLY

(75) Inventors: Frank Podeyn, Eldingen (DE); Thomas Weise, Unterluess (DE)

(73) Assignee: Rheinmetall W & M GmbH, Unterluss (DE)

( * ) Notice: Subject to any disclaimer, the term of this patent is extended or adjusted under 35 U.S.C. 154(b) by 29 days.

(21) Appl. No.: 09/897,432

(22) Filed: Jul. 3, 2001

(65) Prior Publication Data

US 2002/0043878 A1 Apr. 18, 2002

(30) Foreign Application Priority Data

Jul. 5, 2000 (DE) ......................... 100 32 639

(51) Int. Cl.⁷ ................................ H03K 3/00
(52) U.S. Cl. ...................................... 307/108
(58) Field of Search ......................... 307/108

(56) References Cited

U.S. PATENT DOCUMENTS

| 5,559,404 A | * | 9/1996 | MacDougall et al. | 315/209 CD |
| 5,914,974 A | * | 6/1999 | Partlo et al. | 307/108 |
| 2002/0043878 A1 | * | 4/2002 | Podeyn et al. | 307/108 |

FOREIGN PATENT DOCUMENTS

WO    WO 00/11784   *  3/2000  ............ H03K/3/45

* cited by examiner

Primary Examiner—Fritz Fleming
(74) Attorney, Agent, or Firm—Venable LLP; Norman N. Kunitz

(57) ABSTRACT

Energy-supply systems that supply energy in the power range of a few Megawatts (MW) to Gigawatts (GW) within a pulse duration of a few milliseconds (ms) are referred to as pulse-current supplies. Such known energy supply system primarily comprises a charging device for charging an energy store, a plurality of plate-type capacitors as energy stores, a high-power switch for releasing the stored energy, and a pulse-shaping device. The structural shape required for storing the energy in particular makes known pulse-current supplies highly complex, voluminous and costly. In contrast, the present invention involves using wound capacitors (20) and high-power switches (4) instead of conventional plate-type capacitors and high-power radio paths, which reduces the structural space requirement. The pulse shaping is effected by a toroidal coil (5) and a free-wheeling diode (3). Light-switched thyristors mounted in the free space (5.1) of the toroid coil (5) can preferably be used as high-power switches (4).

15 Claims, 3 Drawing Sheets

COMPACT PULSE-CURRENT SUPPLY

CROSS REFERENCE TO RELATED APPLICATION

This application claims the priority of German Patent Application No. 100 32 639.0 filed Jul. 5, 2000, which is incorporated herein by reference.

BACKGROUND OF THE INVENTION

The invention relates to a compact pulse-current supply for generating high-power pulses. More particularly, the present invention relates to a pulse-current supply for generating high-power pulses having an energy store that is connected to a voltage source, a high-power switch for releasing the stored energy and a downstream connected pulse-shaping device.

Energy-supply systems that supply energy in the power range of a few Megawatts (MW) to Gigawatts (GW) within a pulse duration of a few milliseconds (ms) are referred to as pulse-current supplies. These pulse-current supplies are independent of the quantity of stored energy, and essentially comprise a charging device for charging an energy store, a plurality of plate-type capacitors as energy stores, a high-power switch for releasing the stored energy, and a pulse-shaping device.

DE 195 32 219 A1, corresponding to U.S. Pat. No. 5,748,563, presents this design in a block diagram. A high-power radio path functions as the pulse-shaping device, thereby receiving a voltage of about 25 KV and a current of up to 100 KA from the pulse-current supply. The structural space required for storing the energy, in particular, makes the pulse-current supply highly complex, voluminous and costly.

It is therefore the object of the invention to provide a pulse-current supply in which the necessary structural space is reduced, so the supply can have a compact design and be mobile.

SUMMARY OF THE INVENTION

The above object generally is achieved according to the present invention by a pulse-current supply for generating high-power pulses comprising: an energy store that is connected to a voltage source; a high-power switch connected to the energy store for releasing the stored energy; and a pulse-shaping device connected down stream of the switch; and wherein a high-power capacitor functions as the energy store, and has at least one wound capacitor or a plurality of capacitors that are electrically wired or connected to one another; and a semiconductor switch disposed downstream of the high-power capacitor is used as the high-power switch.

The idea underlying the invention is to use wound capacitors and semiconductor switches instead of conventional plate-type capacitors and high-power radio paths, which reduces the structural space requirement. A coil having a free-wheeling diode shapes the pulse.

A wound capacitor of this type is known from DE 198 14 700 A1. According to the reference, the capacitor has a high energy-storage density and small dimensions.

Light-switched thyristors, as described, for example, in DE 196 50 762 A1, can be used as the semiconductor switches.

In a special embodiment, the wound capacitor comprises wound, metal-coated polypropylene films that are accommodated in a housing, wired to one another and cast. The structure is cast in a synthetic resin, which prevents instability, especially in mobile implementation of the pulse-current supply.

In a preferred embodiment, the coil is configured as a toroid or has a toroidal construction. The light-switched thyristor(s) can be mounted in the central region of the coil, which has no magnetic field, saving additional structural space. It is possible to utilize the interior of the coil because it is known that no magnetic field is present in the central region in toroidal coils, i.e., the field is held in the coil body.

The use of light-fired thyristors can eliminate the complicated actuation electronics.

The mechanical construction of the pulse-current supply is layered so as to effect the electrical contacting, so no cable connections are necessary, and the entire pulse-current supply is mechanically and electrically stable.

The invention is described in detail below via an exemplary embodiment illustrated in the drawings.

DETAILED DESCRIPTION OF THE PREFERRED EMBODIMENTS

Figure 1:
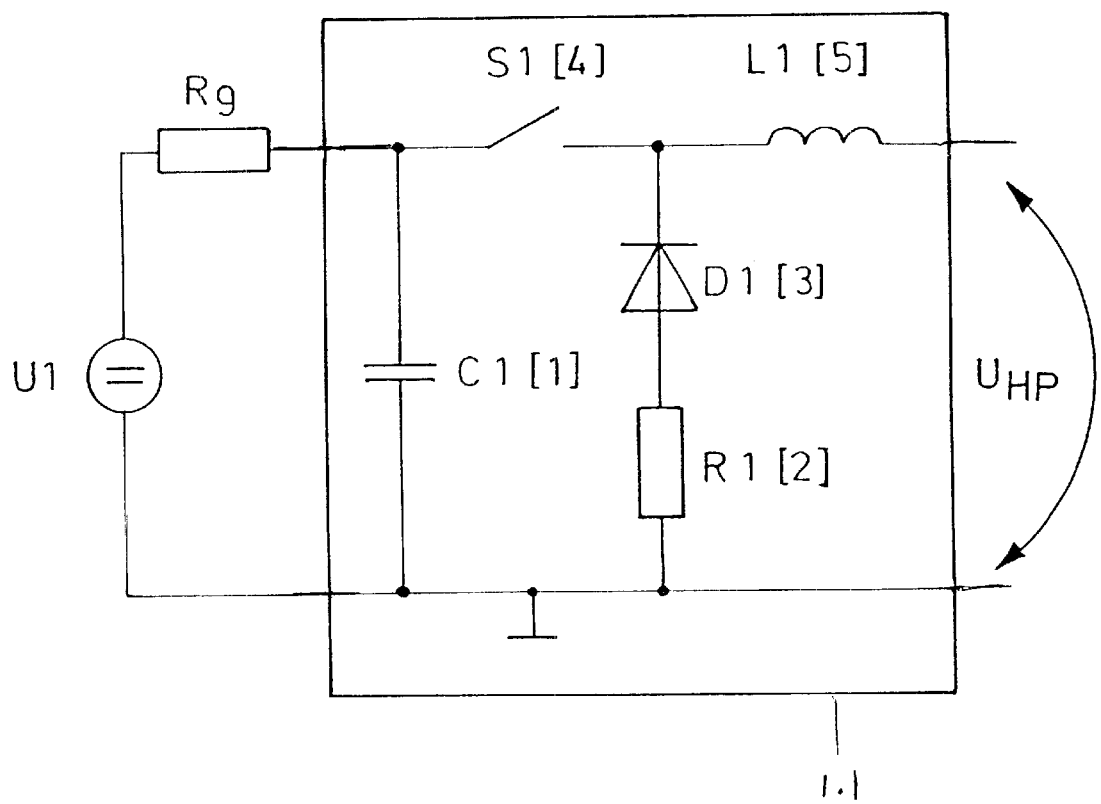
FIG. 1 is a basic circuit diagram of a pulse-current supply.

FIG. 1 is a basic circuit diagram of a pulse-current supply 10. The supply includes a voltage source $U_1$ having associated adaptation and protection electronics, which are shown as a total resistance Rg for the sake of a clear overview. Connected to this voltage source $U_1$ is a high-power capacitor 1 ($C_1$), which is connected in parallel with the voltage source $U_1$, and an associated, series-connected semiconductor switch 4 ($S_1$). A diode 3 ($D_1$)as a free-wheeling diode, and a resistor 2 ($R_1$) as a damping resistor are connected in series with each other and in parallel with the source $U_1$; also connected to the voltage source is a coil 5 ($L_1$), which, on the input side, is connected between the semiconductor switch 4 and the diode 3, and supplies a high-power voltage $U_{HP}$ on the output side.

Figure 2:
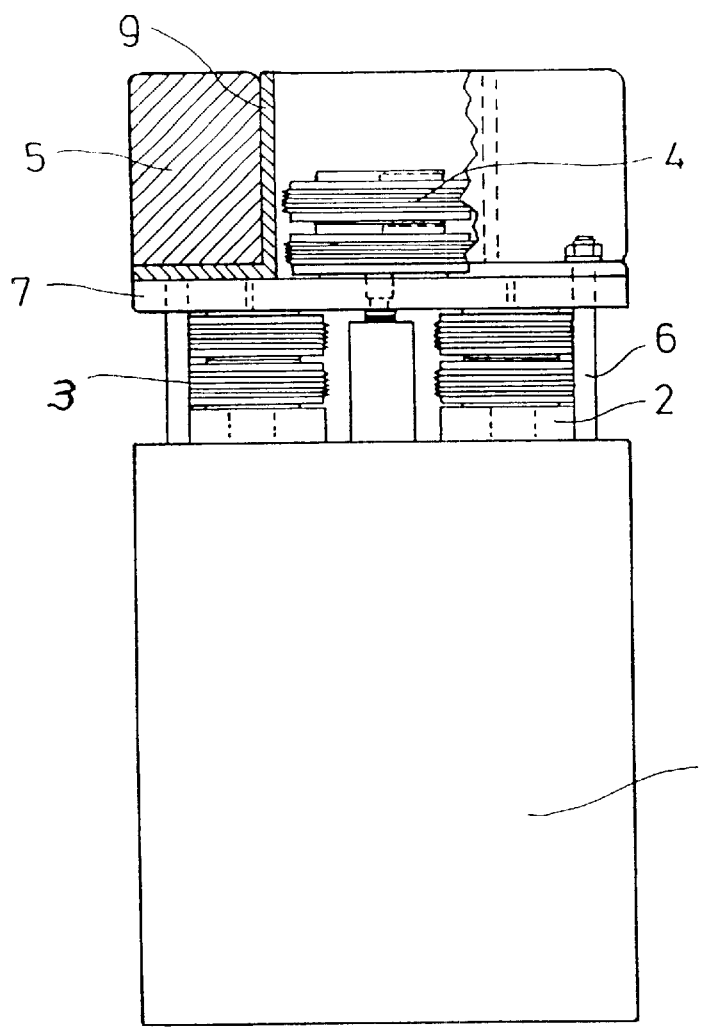
FIG. 2 shows the mechanical construction according to a preferred embodiment of the invention of the pulse-current supply of FIG. 1.

FIG. 2 illustrates the mechanical structure of the pulse-current device 10 of FIG. 1. Here, the voltage source $U_1$ and the total resistance Rg are not shown in detail, but are preferably incorporated into this structure.

Figure 4:
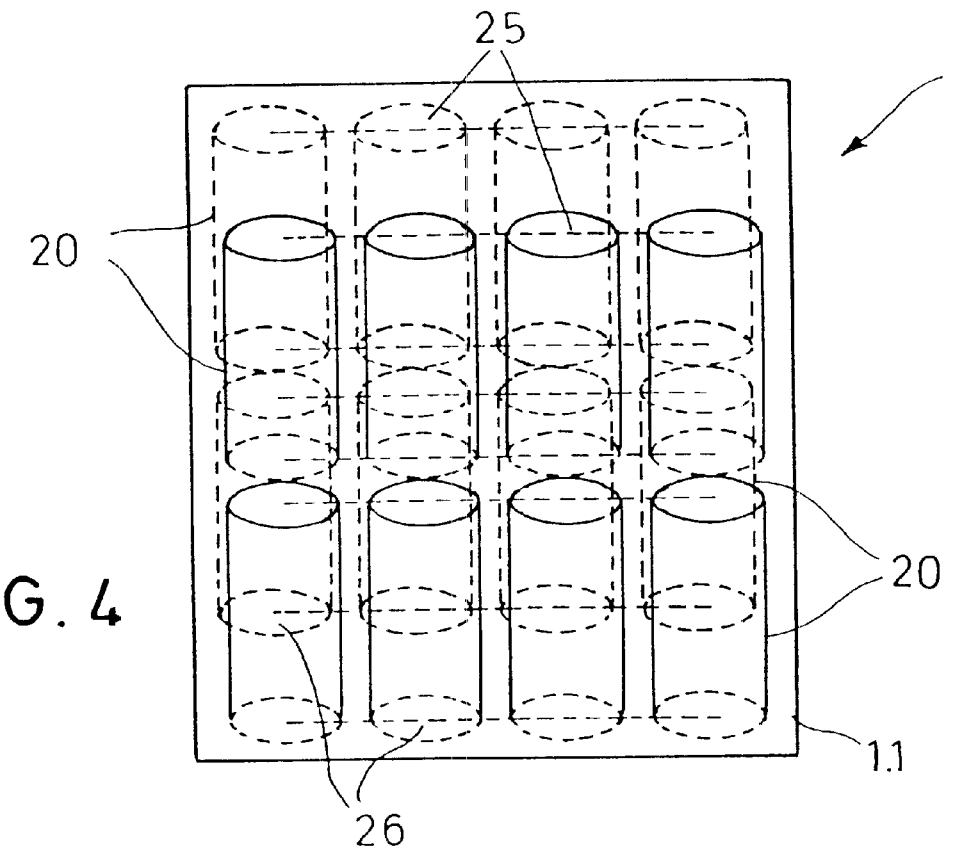
FIG. 4 shows the interconnection of a plurality of wound capacitors to form a high-power capacitor in the circuit according to the invention.

As shown in FIG. 2, the pulse-current device 10 is structured in layers. The primary component is the high-power capacitor 1, which is formed from one or a plurality of wound capacitors 20 (See. FIG. 4) mounted and wired in a housing 1.1 (to be explained below). The resistor 2 and the diode 3 are mechanically mounted one after the other on the high-power capacitor 1, and are simultaneously electrically wired or connected together. The resistor 2 is preferably embodied as a ceramic wafer. The diode 3 is wired or connected, via a contact plate 7 comprising aluminum or steel, to the coil 5 and the high-power switch 4 disposed in the free space 5.1 of the coil 5. The coil 5 is embodied as a high-current coil with a toroidal construction. The toroidal shape ensures that a magnetic field building up in the free space 5.1 of the coil 5 is equal to zero, because the magnetic field remains in the winding body of the coil 5. No outside electromagnetic fields occur in this embodiment. The semiconductor switch 4 is formed from one or a plurality of light-switched thyristors connected in series. An insulating body 9, which preferably has the shape of a hat that is open on both sides i.e., a vertical cylinder with an annular base, is disposed between the semiconductor switch 4 and the coil 5, and between the coil 5 and the contact plate 7. Threaded rods 6 comprising glass-fiber-reinforced plastic hold the layered structure together.

Figure 2A:
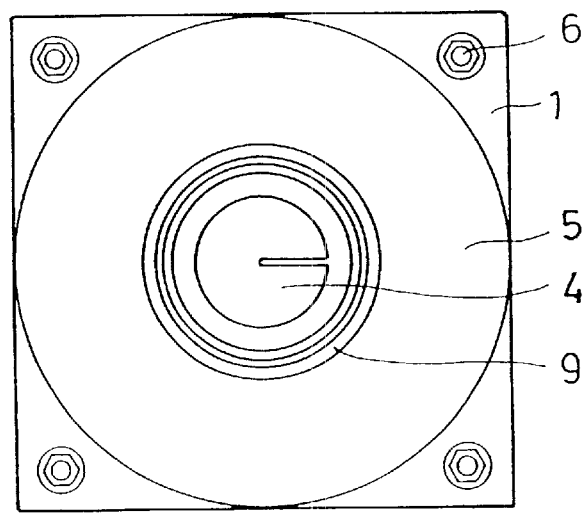
FIG. 2a shows a plan view of the pulse-current supply of FIG. 2.

FIG. 2a is a plan view of the pulse-current supply 10. With an electrical energy content of about 120 KJ, the outside dimensions of the entire pulse-current supply 10 are about 400×400×750 nm, so this pulse-current supply can easily be integrated into a vehicle (not shown in detail). A vehicle battery can function as the voltage source $U_1$ in this case.

The structural reduction is primarily attributed to the special design of the high-power capacitor 1 comprising a plurality of electrically-connected wound capacitors 20.

Figure 3:
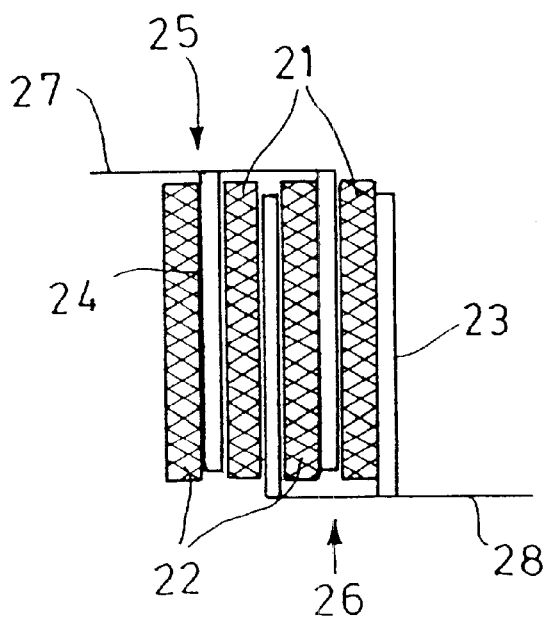
FIG. 3 is a sectional, fragmentary representation of a wound capacitor.

FIG. 3 illustrates the fundamental design of the wound capacitor 20. Two polypropylene films 21, 22 are coated with a metallic, e.g., aluminum, layers 23, 24, respectively, then wound to form a capacitor 20. The individually-wound films 21, 22 are connected with their layers 23, 24 at the upper end face 25 or lower end face 26, resulting in the external connections 27, 28 of the wound capacitor 20. The films 21, 22 form the dielectric, and have a high breakdown strength. The layers 23, 24 constitute the electrodes. It must be noted here that, the thinner the electrodes 23, 24 in relation to the films 21, 22, the higher the electrical energy density of the capacitor. Therefore, the thickness of the films 21, 22 is in the $\mu$m range, while the thickness of the layers 23, 24 is in the $\mu$m range.

An energy density of at least 2 MJ per cubic meter is required for integrating a pulse-current supply of this type into a vehicle for the purpose of supplying an electrical or partially-electrical weapons system. To this end, a plurality of wound capacitors 20 is mounted in the housing 1.1 and wired to form a large high-power capacitor 1, as shown in FIG. 4. The housing 1.1 is preferably cast as a synthetic resin, such as an epoxy resin.

Finally, it is understood that the term vehicle includes motor and utility vehicles, aircraft and ships, tanks or tank-like vehicles, howitzers, etc. Mobile implementation is, however, not limited to vehicles of this nature.

The invention now being fully described, it will be apparent to one of ordinary skill in the art that many changes and modifications can be made thereto without departing from the spirit or scope of the invention as set forth herein.

What is claimed is:

1. A pulse-current supply for generating high-power pulses comprising: a single energy store connected to a voltage source; a single high-power switch connected to the energy store for releasing the stored energy to a load terminal; and a pulse-shaping circuit connected downstream of the switch between the switch and the load terminal; and wherein the energy store is a high-power capacitor formed of at least one wound capacitor; and the high-power switch is a semiconductor switch connected downstream of the high-power capacitor and between the capacitor and the pulse-shaping circuit.

2. The pulse-current supply according to claim 1, wherein the energy store comprises a plurality of wound capacitors that are electrically wired to one another.

3. The pulse-current supply according to claim 1, wherein the semiconductor switch comprises at least one light-switched thyristor.

4. The pulse-current supply according to claim 1 wherein the pulse-shaping device includes a single coil and a diode.

5. The pulse-current supply according to claim 4, wherein the diode is connected in parallel with the energy store, and the coil is connected in series with the energy source.

6. The pulse-current supply according to claim 4, wherein the coil is a toroid coil.

7. The pulse-current supply according to claim 2, wherein the plurality of wound capacitors forming the energy store are integrated into a common housing; a series connection of a resistor and a diode, which forms a part of said pulse-shaping circuit, is connected in parallel with the energy store via the switch and is mechanically secured to a surface of the housing; a contact plate that is mechanically connected to a coil, which forms a further part of the pulse shaping circuit, is disposed on and electrically connected to the diode; the coil is a toroidal coil disposed on a surface of the contact place; the high-power switch is secured on and electrically connected to the contact plate and is disposed in the free space of the toroidal coil; and an insulating body is disposed between the high-power switch and the coil, as well as between the toroidal coil and the contact plate.

8. The pulse-current supply according to claim 7, wherein the mechanical connections effect the electrical contacts.

9. The pulse-current supply according to claim 1, wherein the wound capacitor comprises wound polypropylene film that are coated with metal, with the polypropylene films functioning as a dielectric.

10. he pulse-current supply according to claim 7, wherein any hollow spaces remaining between the wound capacitors in the housing are filled by a cast synthetic resin.

11. The pulse-current supply according to claim 5, wherein a resistor is connected in series with the diode.

12. A pulse-current supply for generating high-power pulses comprising an energy store connected to a voltage source, a high-power switch connected to the energy store for releasing the stored energy, and a pulse-shaping circuit connected downstream of the switch; and wherein:

the energy store is a high-power capacitor formed of a plurality of wound capacitors that are electrically wired to one another;

the high-power switch is a semiconductor switch connected downstream of the high-power capacitor;

the plurality of wound capacitors forming the energy store are integrated into a common housing;

a series connection of a resistor and a diode, which forms a part of said pulse-shaping circuit, is connected in parallel with the energy store via the switch and is mechanically secured to a surface of the housing;

a contact plate that is mechanically connected to a coil, which forms a further part of the pulse shaping circuit, is disposed on and electrically connected to the diode;

the coil is a toroidal coil disposed on a surface of the contact place;

the high-power switch is secured on and electrically connected to the contact plate and is disposed in the free space of the toroidal coil; and, an insulating body is disposed between the high-power switch and the coil, as well as between the toroidal coil and the contact plate.

13. The pulse-current supply according to claim 12, wherein the mechanical connections effect the electrical contacts.

14. The pulse-current supply according to claim 12, wherein the wound capacitor comprises wound polypropylene films that are coated with metal, with the polypropylene films functioning as a dielectric.

15. The pulse-current supply according to claim 12, wherein any hollow spaces remaining between the wound capacitors in the housing are filled by a cast synthetic resin.

* * * * *